United States Patent
Ni et al.

(10) Patent No.: US 10,627,454 B2
(45) Date of Patent: Apr. 21, 2020

(54) GROUNDING WIRE DETECTION CIRCUIT

(71) Applicant: Delta Electronics (Shanghai) CO., LTD, Shanghai (CN)

(72) Inventors: Shiyong Ni, Shanghai (CN); Yinping Yang, Shanghai (CN); Baohua Wang, Shanghai (CN); Dezhi Jiao, Shanghai (CN)

(73) Assignee: Delta Electronics (Shanghai) CO., LTD, Shanghai (CN)

(*) Notice: Subject to any disclaimer, the term of this patent is extended or adjusted under 35 U.S.C. 154(b) by 136 days.

(21) Appl. No.: 15/892,382

(22) Filed: Feb. 8, 2018

(65) Prior Publication Data
US 2018/0238952 A1    Aug. 23, 2018

(30) Foreign Application Priority Data
Feb. 21, 2017  (CN) .......................... 2017 1 0093013

(51) Int. Cl.
*G01R 31/14*    (2006.01)
*G01R 31/50*    (2020.01)
(Continued)

(52) U.S. Cl.
CPC .............. *G01R 31/50* (2020.01); *H02H 3/16* (2013.01); *H02H 5/105* (2013.01)

(58) Field of Classification Search
CPC .. G01R 31/006; G01R 31/0069; G01R 31/02; G01R 31/025; G01R 31/026;
(Continued)

(56) References Cited

U.S. PATENT DOCUMENTS 9,099,931 B2 *   8/2015   Takahashi ............. H02M 7/217
9,398,662 B2 *   7/2016   Guan ...................... H05B 45/14
(Continued)

FOREIGN PATENT DOCUMENTS

CN    101436939 A    5/2009
CN    103378580 A    10/2013
(Continued)

OTHER PUBLICATIONS

The CN1OA issued Nov. 29, 2019 by the CNIPA.

*Primary Examiner* — Thang X Le
(74) *Attorney, Agent, or Firm* — Yunling Ren (57) ABSTRACT

The present disclosure discloses a grounding wire detection circuit, for monitoring whether an electrical device is grounded in real time, the grounding wire detection circuit including: a grounding detection circuit and a sampling control circuit, wherein the grounding detection circuit is electrically connected to a live wire, a neutral wire and a grounding wire of a single-phase three-wire type input, the live wire and the neutral wire are electrically connected to a main circuit of the electrical device; and the sampling control circuit is configured to isolate a current detected by the grounding detection circuit and convert the current into a sampling voltage. The real-time monitoring of whether or not a device is grounded may be achieved by detecting the sampling voltage, so as to alarm, cut off electrical device accordingly, which can improve safety of using the electrical device.

15 Claims, 7 Drawing Sheets

(51) Int. Cl.
*H02H 3/16* (2006.01)
*H02H 5/10* (2006.01)

(58) Field of Classification Search
CPC .... G01R 31/14; G01R 31/086; G01R 31/385; G01R 1/203; G01R 19/155; G01R 19/2506
See application file for complete search history.

(56) References Cited

U.S. PATENT DOCUMENTS

| | | | | |
|---|---|---|---|---|
| 2004/0037018 A1* | 2/2004 | Kim | ............... | H01R 13/7135 361/42 |
| 2009/0121739 A1* | 5/2009 | Kuo | ............... | G01R 19/155 324/764.01 |
| 2012/0249154 A1* | 10/2012 | Dao | ............... | B60L 3/0069 324/509 |
| 2013/0271887 A1* | 10/2013 | Zhang | ............... | H02H 3/20 361/91.5 |
| 2016/0011236 A1* | 1/2016 | Wang | ............... | G01R 15/22 324/126 |
| 2018/0149688 A1* | 5/2018 | Huang | ............... | G01R 31/025 |

FOREIGN PATENT DOCUMENTS

| | | |
|---|---|---|
| CN | 103825146 A | 5/2014 |
| CN | 104898015 A | 9/2015 |
| CN | 205945014 U | 2/2017 |

* cited by examiner

GROUNDING WIRE DETECTION CIRCUIT

CROSS REFERENCE

This application is based upon and claims priority to Chinese Patent Application No. 201710093013.1, filed on Feb. 21, 2017, the entire contents thereof are incorporated herein by reference.

TECHNICAL FIELD

The present disclosure relates to the field of electrical safety, and in particular to a grounding wire detection circuit.

BACKGROUND

With the widespread use of electrical devices, the safety hazards caused by electrical devices are more and more concerned. In order to prevent electric shock accidents and reduce touch current, it is necessary to ground exposed conductive parts of the device that is floating, thus preventing electrical shock accidents through equipotential of a person and the device. Therefore, input for most of small and medium-sized power electrical devices is in a single-phase three-wire type, i.e., a live wire L, a neutral wire N and a grounding wire PE.

Grounding may provide a discharge loop for static electricity and other instantaneous energy, to ensure safe operation of the device. In some occasions, it may even cause a danger when the device is not connected to a grounding wire. For example, if a medical hydrogen generator is not connected to a ground, energy generated by the static electricity may produce electric spark due to lack of the discharge loop, which leads to explosion of the hydrogen, thus the electrical device is required to send an alarm signal or be directly cut off the operation when not grounded.

The reliable grounding of the electrical device may avoid the electric shock, which improves the safety of the electrical device and safety of the user. The existing electrical devices have a grounding wire, but there is no corresponding apparatus to judge whether or not the device is grounded when the device is operating. An existing grounding wire detection circuit is grounding wire missing detection of battery, to detect grounding between a battery shell and a cathode of the battery, which is not suitable for the grounding wire detection of devices using utility power grid. Therefore, the grounding wire detection of electrical devices using utility power grid is particularly important.

Therefore, a new grounding wire detection circuit, which may achieve real-time monitoring of whether or not a device is grounded, thus improving the safety of using the electrical device, is needed.

The above information disclosed in the Background section is only for enhancing the understanding of the background of the present disclosure, and therefore, it may include information that does not constitute prior art known to those skilled in the art.

SUMMARY

The present disclosure provides a grounding wire detection circuit, so as to overcome one or more aforesaid problems resulting from limitation and defects of related technologies at least to a certain degree.

The other characteristics and advantages of the present disclosure may become apparent from the following detailed description, or be partly learned from the practice of the present disclosure.

According to an embodiment of the present disclosure, there is provided a grounding wire detection circuit, for monitoring whether an electrical device is grounded in real time, the grounding wire detection circuit includes:

a grounding detection circuit and a sampling control circuit, wherein the grounding detection circuit is electrically connected to a live wire, a neutral wire and a grounding wire of a single-phase three-wire type, and the live wire and the neutral wire are electrically connected to a main circuit of the electrical device; and the sampling control circuit is configured to isolate a current detected by the grounding detection circuit and convert the current into a sampling voltage.

According to some embodiments of the present disclosure, a grounding detection circuit detects a loop current, a sampling control circuit isolates the current detected by the grounding detection circuit and converts it into a sampling voltage. The real-time monitoring of whether or not a device is grounded may be achieved by detecting the sampling voltage, so as to alarm, cut off the electrical device accordingly, which can improve safety of using the electrical device.

According to other embodiments of the present disclosure, the grounding detection circuit further includes a current limiting unit electrically connected between a cathode of a primary side of the photoelectric coupler and a grounding wire, such that the current detected by the grounding detection circuit is in a μA level, which improves the usage safety of the electrical device, and meanwhile ensures the safety of the grounding wire detection circuit.

It is to be understood that both the foregoing general description and the following detailed description are exemplary only and do not limit the present disclosure.

BRIEF DESCRIPTION OF THE DRAWINGS

The above and other features and advantages of the present disclosure will become more apparent by describing its exemplary embodiments in detail with reference to the accompanying drawings.

DETAILED DESCRIPTION

The exemplary implementations of the present disclosure will now be described in more detail with reference to accompanying drawings. The exemplary implementations, however, may be implemented in various forms, and should not be construed as been limited to the embodiments set forth herein; instead, the implementations are provided such that the present disclosure will be more thorough and complete, and will fully convey the concept of exemplary implementations to those skilled in the art. The drawings are merely illustrative of the present disclosure and are not necessarily drawn to scale.

In addition, the features, structures or characteristics described may be combined in one or more implementations in any suitable manner. In the following description, many specific details are provided to give a full understanding of the implementations of the present disclosure. However, those skilled in the art will appreciate that, the technical solutions of the present disclosure may be practiced without one or more of these specific details, or other methods, elements, steps and the like may be employed. In other instances, well-known structures, methods, implementations or operations are not shown or described in detail to avoid obscuring aspects of the present disclosure.

Some of the block diagrams shown in the drawings are functional entities that do not necessarily correspond to physical or logically independent entities. These functional entities may be implemented in one or more hardware modules or integrated circuits, or may be implemented in different networks and/or processor devices and/or microcontroller devices.

The present disclosure proposes a grounding wire detection circuit, for judging whether or not the electrical device is connected to the grounding wire by using voltage values sampled in the circuit. The grounding wire detection circuit of the present disclosure includes: a grounding detection circuit and a sampling control circuit, wherein the grounding detection circuit is electrically connected to a live wire, a neutral wire and a grounding wire of a single-phase three-wire type input, and the live wire and the neutral wire are electrically connected to a main circuit of the electrical device. The sampling control circuit is configured to isolate a current detected by the grounding detection circuit and convert the current into a sampling voltage. The real-time monitoring of whether or not a device is grounded may be achieved by detecting the sampling voltage, so as to alarm and/or cut off the electrical device accordingly, which can improve safety of using the electrical device. The electrical device mentioned in the present disclosure may be a variety of household appliances, industrial electrical devices and medical devices, but is not limited thereto.

Figure 1:
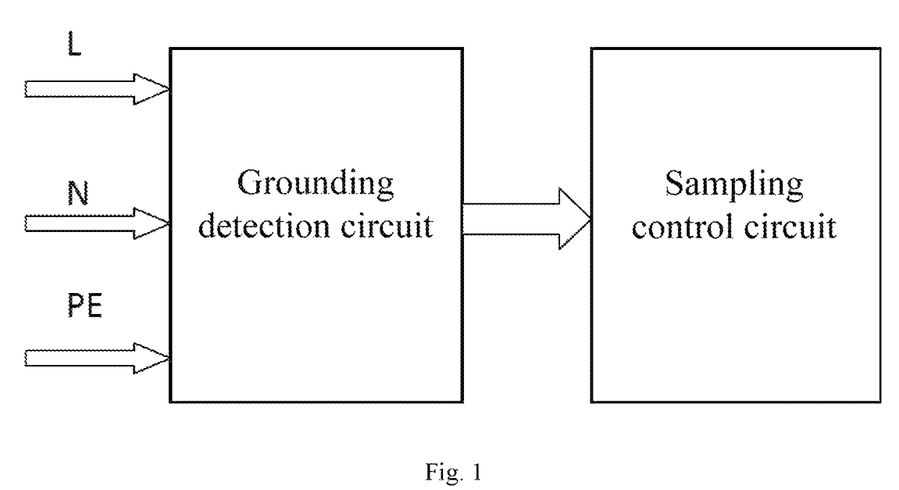
FIG. 1 shows a block diagram of a grounding wire detection circuit according to an exemplary embodiment of the present disclosure.

FIG. 1 shows a block diagram of a grounding wire detection circuit according to an exemplary embodiment of the present disclosure. Since input of most small and medium-sized power electrical devices is in a single-phase three-wire type, i.e., a live wire L, a neutral wire N and a grounding wire PE, the grounding wire detection circuit of the present disclosure is mainly designed based on the single-phase three-wire type.

As shown in FIG. 1, the grounding wire detection circuit for monitoring whether or not an electrical device is grounded in real time includes: a grounding detection circuit and a sampling control circuit, wherein the grounding detection circuit is electrically connected to a live wire L, a neutral wire N and a grounding wire PE of a single-phase three-wire type input, the live wire L and the neutral wire N are electrically connected to a main circuit of the electrical device; and the sampling control circuit is configured to isolate a current detected by the grounding detection circuit and convert the current into a sampling voltage, so as to perform real-time monitoring.

The real-time monitoring of whether or not an electrical device is grounded may be achieved by judging the detected sampling voltage, so as to alarm and/or cut off the electrical device accordingly, which may improve safety of using the electrical device. Under normal circumstances, it is enough to alarm when it is monitored that the electrical device is not grounded. However, in some special or extreme circumstances or occasions, for example, if a medical hydrogen generator is not grounded, the energy generated by static electricity is possible to generate electric spark due to lack of a discharge loop, which leads to explosion of the hydrogen, thus the grounding wire detection circuit is required to directly cut off the electrical device when the device is not grounded, to avoid the danger caused by reaction of operators being not timely.

Hereinafter, specific examples of various parts of the grounding wire detection circuit of the exemplary embodiment of the present disclosure will be described in detail with reference to the accompanying drawings.

Figure 2A:
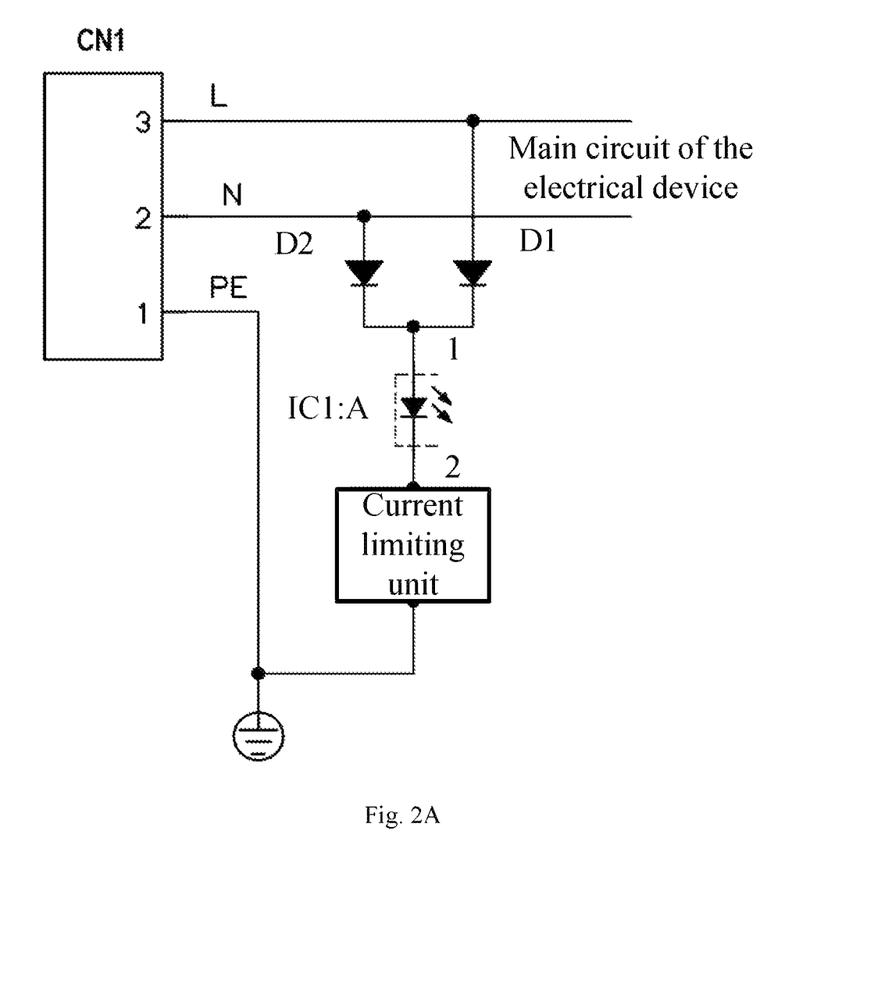
FIG. 2A shows a diagram of a grounding detection circuit of a grounding wire detection circuit according to an exemplary embodiment of the present disclosure.

FIG. 2A shows a diagram of a grounding detection circuit of a grounding wire detection circuit according to an exemplary embodiment of the present disclosure.

As shown in FIG. 2A, the grounding detection circuit in the grounding wire detection circuit includes a first diode D1, a second diode D2, and a primary side IC1:A (i.e., which is usually called a light emitting diode) of a photoelectric coupler, wherein an anode of the first diode D1 is electrically connected to a live wire L (led from an interface 3 of a connector CN1) of the connector CN1 for connecting the utility power grid, an anode of the second diode D2 is electrically connected to a neutral wire N (led from an interface 2 of the connector CN1) of the connector CN1, a cathode of the first diode D1 and a cathode of the second diode D2 are electrically connected to an anode 1 of the primary side IC1:A of the photoelectric coupler at the same time, a cathode 2 of the primary side IC1:A of the photoelectric coupler is electrically connected to a first terminal of the current limiting unit, and a second terminal of the current limiting unit is electrically connected to the grounding wire (connected to an interface 1 of the connector CN1). Generally, the connector CN1 is the most commonly used single-phase three-wire socket for connecting the utility power grid, but is not limited thereto, as long as it is a device capable of providing single-phase three-wire power supply. Usually, the input AC voltage is 90V-264V.

Of course, as mentioned above, at this time, the live wire L and the neutral wire N of the connector CN1 are also electrically connected to a main circuit of the electrical device.

The operation principle of the grounding detection circuit in the grounding wire detection circuit shown in FIG. 2A will be described in detail below.

When the electrical device is connected to the grounding wire PE, the input AC voltage live wire L, the first diode D1, the primary side IC1:A of the photoelectric coupler, the current limiting unit and grounding wire PE constitute a closed loop, or the input AC voltage neutral wire N, the second diode D2, the primary side IC1:A of the photoelectric coupler, the current limiting unit and grounding wire PE constitute a closed loop. A current flows through the primary side IC1:A of the photoelectric coupler, and at this time, the primary side IC1:A (i.e., a light emitting diode) of the photoelectric coupler emits light because the current flows through it. On the other hand, when the electrical device is not connected to the grounding wire PE, the diode and the primary side IC1:A of the photoelectric coupler is not in a closed loop, and no current flows through the primary side IC1:A of the photoelectric coupler, and at this time, the primary side IC1:A (i.e., the light emitting diode) of the photoelectric coupler will not emit light because no current flows through it.

Figure 2B:
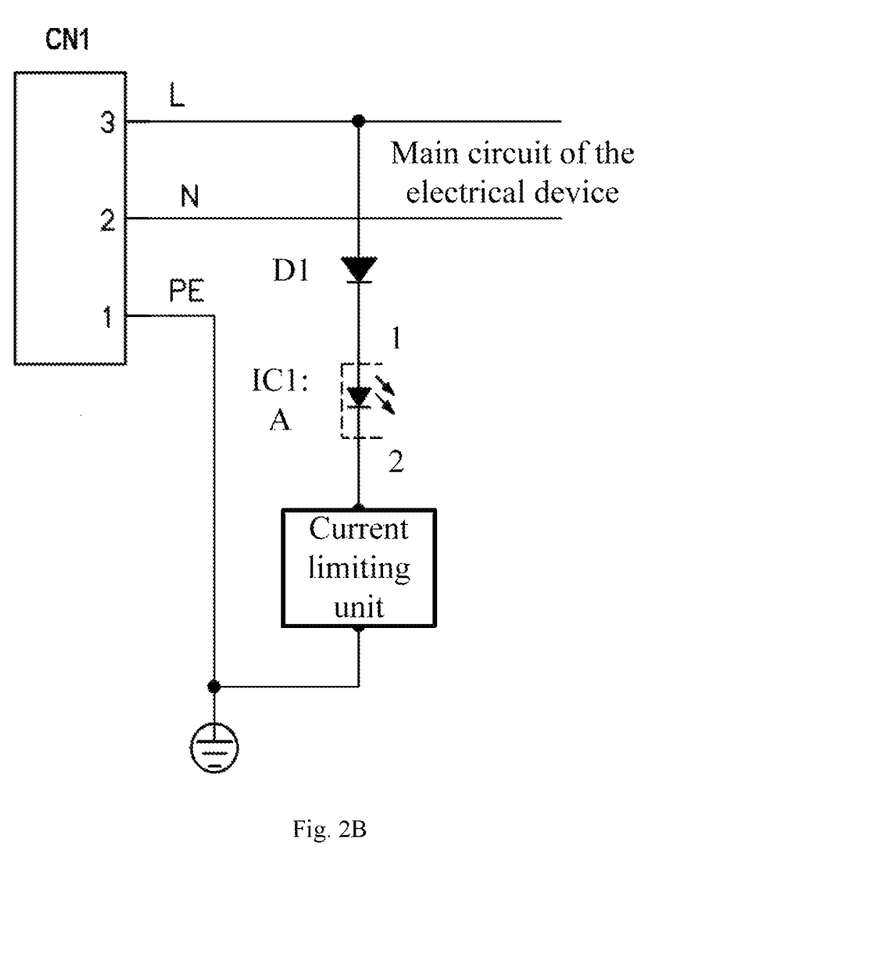
FIG. 2B shows a diagram of a grounding detection circuit of a grounding wire detection circuit according to another exemplary embodiment of the present disclosure.

FIG. 2B shows a diagram of a grounding detection circuit of a grounding wire detection circuit according to another exemplary embodiment of the present disclosure.

The embodiment of FIG. 2B differs from that of FIG. 2A in that the second diode D2 is omitted in FIG. 2B. Since the beginning of the power grid, i.e., the neutral wire N is shorted with the grounding wire PE, the second diode D2 of the embodiment of FIG. 2A is actually shorted when the wiring is correct. Therefore, a voltage difference only exists between L and PE, which can form a closed loop.

Therefore, the embodiment of FIG. 2B must require that L and N are not reversed when used in practice. The embodiment of FIG. 2A is flexible and does not care whether or not L and N are reversed.

An example of the current limiting unit of the grounding detection circuit of the grounding wire detection circuit according to an exemplary embodiment of the present disclosure will be described in detail with reference to FIGS. 3-4.

Figure 3:
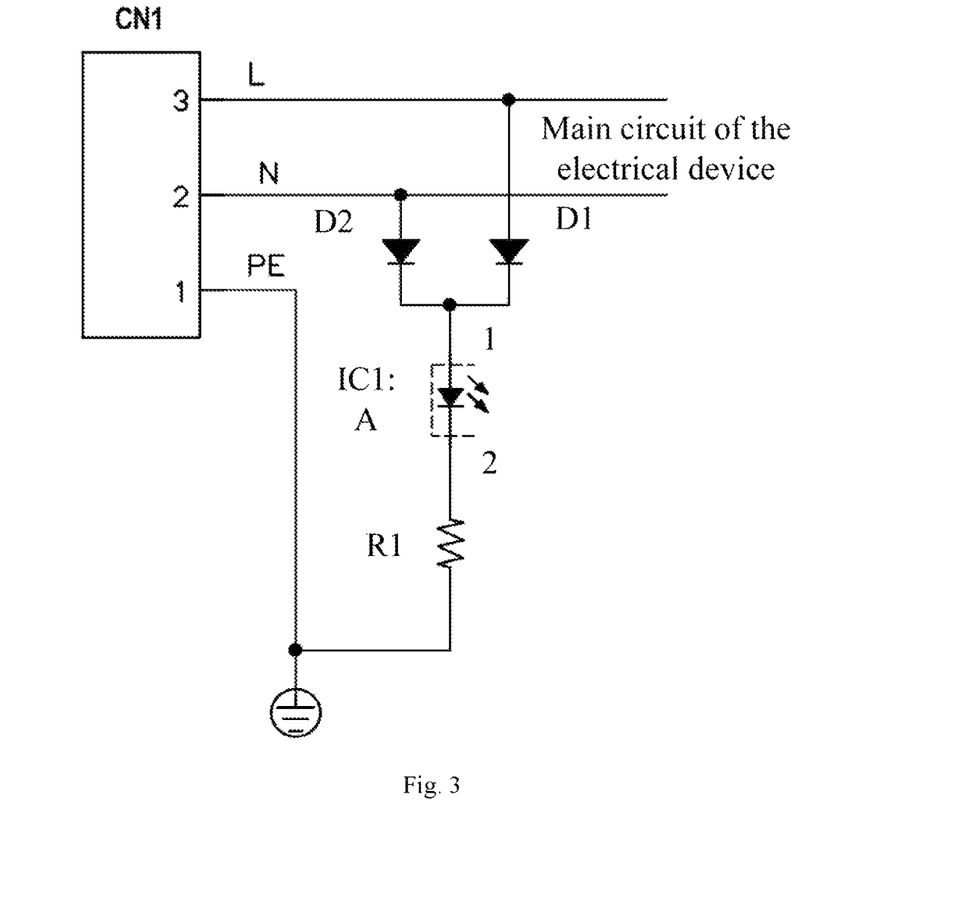
FIG. 3 shows an instance diagram of a current limiting unit of a grounding detection circuit of a grounding wire detection circuit according to an exemplary embodiment of the present disclosure.

FIG. 3 shows an instance diagram of a current limiting unit of a grounding detection circuit of a grounding wire detection circuit according to an exemplary embodiment of the present disclosure.

As shown in FIG. 3, the current limiting unit is a resistor R1, and R1 is not limited to a single resistor, which may also represent several resistors connected in series. A resistor of MΩ level is adopted to limit the loop current to be µA level, but not limited to this. The resistance (current) may be selected as needed. In one embodiment, the loop current does not exceed 5000 µA according to the electrical safety IEC 60601 of the medical device.

When the electrical device is connected to the grounding wire PE, the input AC voltage live wire L, the first diode D1, the primary side IC1:A of the photoelectric coupler, the resistor R1 and grounding wire PE constitute a closed loop, or the input AC voltage neutral wire N, the second diode D2, the primary side IC1:A of the photoelectric coupler, the resistor R1 and grounding wire PE constitute a closed loop. A current of µA level flows through the primary side IC1:A of the photoelectric coupler, and at this time, the primary side IC1:A (i.e., a light emitting diode) of the photoelectric coupler emits light because the current flows through it. On the other hand, when the electrical device is not connected to the grounding wire PE, the diode, the primary side IC1:A of the photoelectric coupler and the resistor R1 are not in a closed loop, no current flows through the primary side IC1:A of the photoelectric coupler, and at this time, the primary side IC1:A (i.e., the light emitting diode) of the photoelectric coupler will not emit light because no current flows through it.

Figure 4:
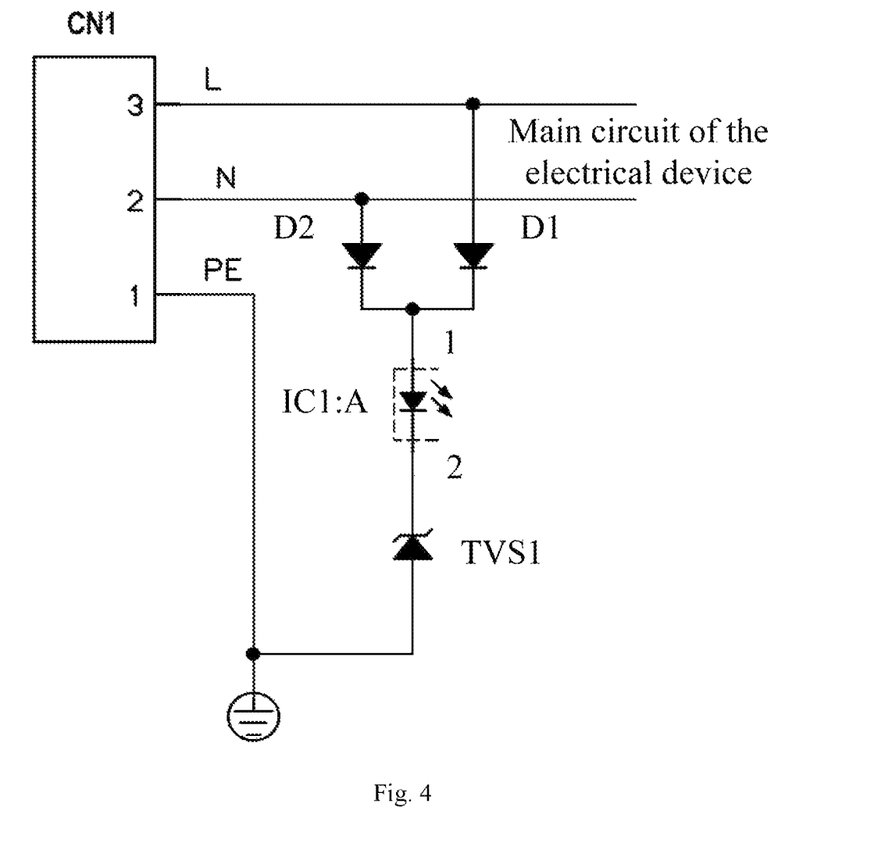
FIG. 4 shows an instance diagram of a current limiting unit of a grounding detection circuit of a grounding wire detection circuit according to another exemplary embodiment of the present disclosure.

FIG. 4 shows an instance diagram of a current limiting unit of a grounding detection circuit of a grounding wire detection circuit according to another exemplary embodiment of the present disclosure.

As shown in FIG. 4, the current limiting unit is a Transient Voltage Suppressor (TVS diode) TVS1, which may be one or more TVS connected in series.

When the electrical device is connected to the grounding wire PE, the input AC voltage live wire L, the first diode D1, the primary side IC1:A of the photoelectric coupler, the Transient Voltage Suppressor TVS1 and grounding wire PE constitute a closed loop, or the input AC voltage neutral wire N, the second diode D2, the primary side IC1:A of the photoelectric coupler, the Transient Voltage Suppressor TVS1 and grounding wire PE constitute a closed loop. A current of µA level flows through the primary side IC1:A of the photoelectric coupler, and at this time, the primary side IC1:A (i.e., a light emitting diode) of the photoelectric coupler emits light because the current flows through it. On the other hand, when the electrical device is not connected to the grounding wire PE, the diode, the primary side IC1:A of the photoelectric coupler and the Transient Voltage Suppressor TVS1 are not in a closed loop, and no current flows through the primary side IC1:A of the photoelectric coupler, and at this time, the primary side IC1:A (i.e., the light emitting diode) of the photoelectric coupler will not emit light because no current flows through it.

Figure 5:
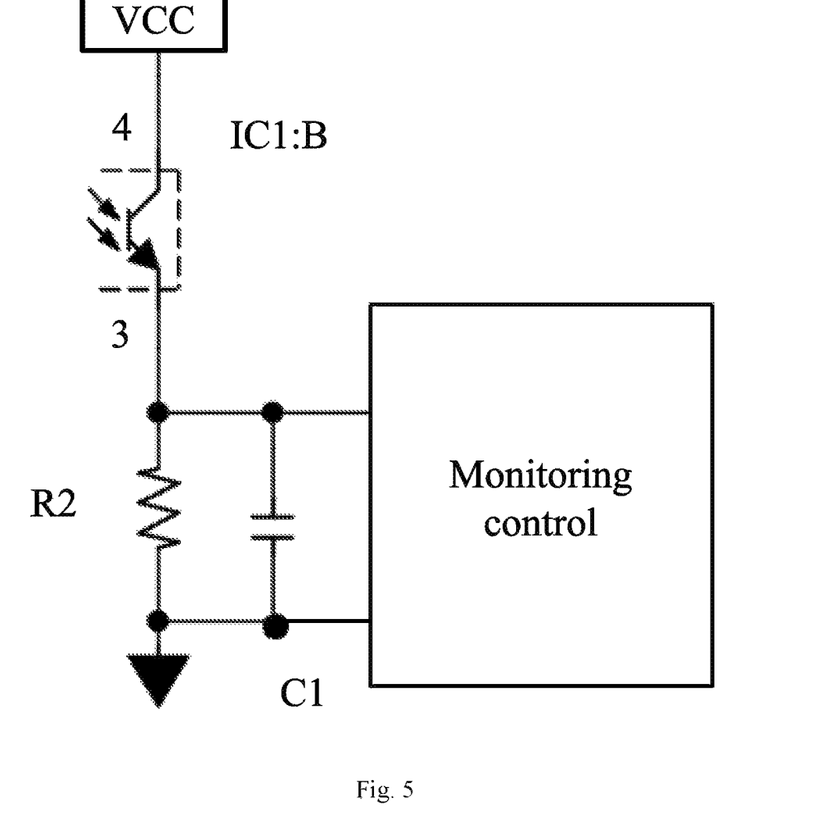
FIG. 5 shows a diagram of a sampling control circuit of a grounding wire detection circuit according to an exemplary embodiment of the present disclosure.

FIG. 5 shows a diagram of a sampling control circuit of a grounding wire detection circuit according to an exemplary embodiment of the present disclosure.

As shown in FIG. 5, the sampling control circuit in the grounding wire detection circuit is composed of a power supply VCC, a photoelectric coupler secondary side IC1:B (which is commonly mentioned as a photosensitive transistor) and a sampling resistor R2.

In this embodiment, the power supply VCC is electrically connected to a collector 4 of the secondary side IC1:B of the photoelectric coupler, and an emitter 3 of the secondary side IC1:B of the photoelectric coupler is electrically connected to a first terminal of the sampling resistor R2.

The operation principle of the sampling control circuit is as follows: an isolation effect of the photoelectric coupler is adopted, to isolate the current of the grounding detection circuit. That is, the secondary side IC1:B (which is commonly called as the photosensitive transistor) of the photoelectric coupler receives the light emitted from the primary side IC1:A (i.e., the light emitting diode) of the photoelectric coupler to generate a current, and converts it into a voltage signal via the sampling resistor R2. This voltage signal is fed into a post-stage monitoring or control circuit, to achieve protection functions such as alarming, cutting off the operation, and so on.

A voltage signal VR2 sampled on the sampling resistor R2 may be obtained by the following equation:

$$VR2 = I\mu A * CTR * R2$$

wherein IµA is a current flowing through the primary side IC1:A of the photoelectric coupler, and CTR is a current transmission ratio. The sampling resistor R2 is usually selected by a MΩ level, so the sampled voltage signal VR2 is usually no more than 5V.

According to an embodiment of the present disclosure, the sampling control circuit further includes a capacitor C1 connected in parallel with the sampling resistor R2.

According to an embodiment of the present disclosure, the sampling control circuit further includes a post-stage monitoring control circuit configured to receive the sampling voltage, and realize a protection function, the protection function includes: alarming, cutting off the electrical device, and so on.

An example of the sampling control circuit of the grounding wire detection circuit according to an exemplary embodiment of the present disclosure will be described in detail with reference to FIG. 6.

Figure 6:
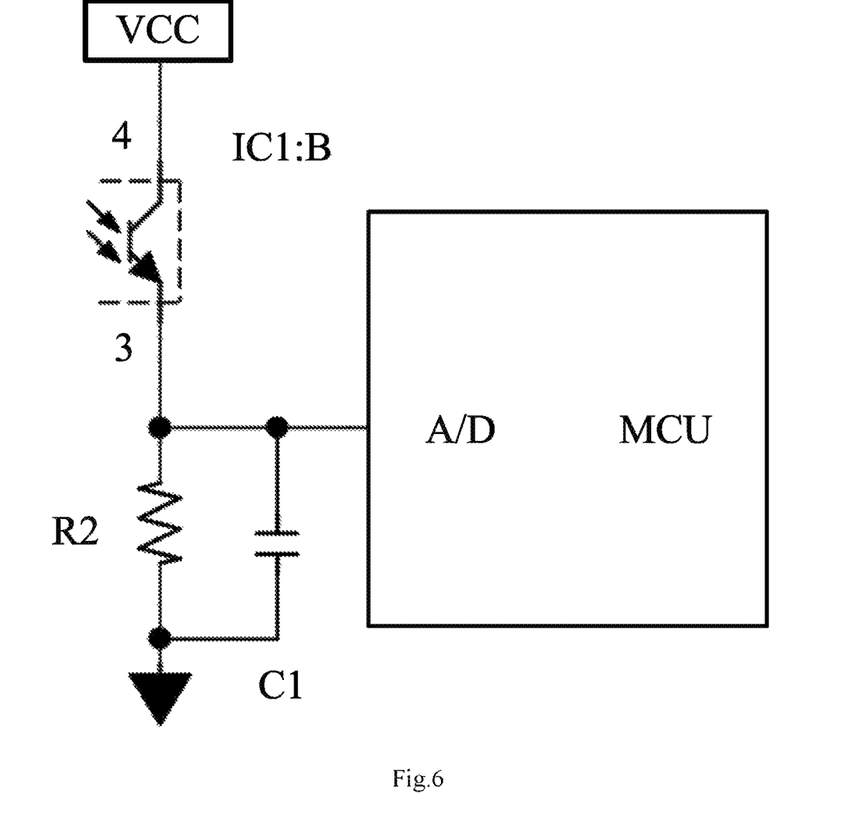
FIG. 6 shows an instance diagram of a sampling control circuit of a grounding wire detection circuit according to an exemplary embodiment of the present disclosure.

FIG. 6 shows an instance diagram of a sampling control circuit of a grounding wire detection circuit according to an exemplary embodiment of the present disclosure.

As shown in FIG. 6, the post-stage monitoring control circuit in the sampling control circuit of the grounding wire detection circuit uses a Microcontroller Unit (MCU).

The voltage sampled on the sampling resistor R2 is fed to an analog-to-digital conversion port (A/D port) of the microcontroller unit MCU for analog-to-digital conversion, and compared with an internal preset reference. If it is lower than the preset reference, the microcontroller MCU sends an alarm signal or directly cuts off the operation. If it is higher than the preset reference, it means that the grounding connection is normal.

According to an embodiment of the present disclosure, the electrical device is a medical hydrogen generator. For example, if a medical hydrogen generator is not grounded, the energy generated by static electricity is possible to generate electric spark due to lack of a discharge loop, which leads to explosion of the hydrogen. Therefore, the grounding wire detection circuit proposed by the present disclosure is required to issue an alarm or even directly cut off operation when the hydrogen generator is not grounded, to avoid the danger caused by reaction of operators being not timely.

From the foregoing detailed description, it will be readily understood by those skilled in the art that the system and method according to embodiments of the present disclosure have one or more of the following advantages.

According to some embodiments of the present disclosure, a grounding detection circuit detects a loop current, a sampling control circuit isolates the current detected by the grounding detection circuit and converts it into a sampling voltage. The real-time monitoring of whether or not a device is grounded may be achieved by detecting the sampling voltage, so as to alarm and/or cut off electrical device accordingly, which can improve safety of using the electrical device.

According to other embodiments of the present disclosure, the grounding detection circuit further includes a current limiting unit electrically connected between a cathode of the primary side of the photoelectric coupler and a grounding wire, such that the current detected by the grounding detection circuit is in a μA level, which not only improves the usage safety of the electrical device, but also ensures the safety of the grounding wire detection circuit.

Other embodiments of the present disclosure will be readily apparent to those skilled in the art upon consideration of the specification and practice of the disclosure disclosed herein. The present application is intended to cover any variations, uses or adaptations of the present disclosure, which are subject to the general principles of the present disclosure and include common knowledge or conventional technical means of the present disclosure which are not disclosed in the present disclosure. The specification and embodiments are to be regarded as illustrative only, and the true scope and spirit of the present disclosure are indicated by the following claims.

It is to be understood that the present disclosure is not limited to the precise constructions described above and illustrated in the accompanying drawings, and that various modifications and changes may be made without departing from the scope thereof. The scope of the present disclosure is limited only by the appended claims.

What is claimed is:

1. A grounding wire detection circuit, for monitoring whether an electrical device is grounded in real time, the grounding wire detection circuit comprising: a grounding detection circuit and a sampling control circuit, wherein
the grounding detection circuit is electrically connected to a live wire, a neutral wire and a grounding wire in a single-phase three-wire type input, and the live wire and the neutral wire are electrically connected to a main circuit of the electrical device,
the sampling control circuit is configured to isolate a current detected by the grounding detection circuit and convert the current into a sampling voltage,
the grounding detection circuit comprises: a first diode, a second diode, a current limiting unit and a primary side of a photoelectric coupler, and
an anode of the first diode is electrically connected to the live wire, an anode of the second diode is electrically connected to the neutral wire, cathodes of the first diode and the second diode are electrically connected to an anode of the primary side of the photoelectric coupler, a cathode of the primary side of the photoelectric coupler is electrically connected to a first terminal of the current limiting unit, and a second terminal of the current limiting unit is electrically connected to the grounding wire.

2. The grounding wire detection circuit according to claim 1, the sampling control circuit comprising: a power supply, a secondary side of a photoelectric coupler and a sampling resistor,
wherein the power supply is electrically connected to a collector of the secondary side of the photoelectric coupler, and an emitter of the photoelectric coupler secondary side is electrically connected to a first terminal of the sampling resistor.

3. The grounding wire detection circuit according to claim 2, wherein the sampling control circuit further comprises a capacitor connected in parallel with the sampling resistor.

4. The grounding wire detection circuit according to claim 3, wherein the sampling control circuit further comprises a post-stage monitoring control circuit, configured to receive the sampling voltage and realize a protection function comprising alarming and cutting off the electrical device.

5. The grounding wire detection circuit according to claim 4, wherein the post-stage monitoring control circuit is a microcontroller unit.

6. The grounding wire detection circuit according to claim 1, wherein the current limiting unit is a resistor or a Transient Voltage Suppressor.

7. The grounding wire detection circuit according to claim 1, wherein the current detected by the grounding detection circuit is in a microampere level.

8. The grounding wire detection circuit according to claim 7, wherein the current detected by the grounding detection circuit does not exceed 5000 microamperes.

9. The grounding wire detection circuit according to claim 1, wherein the electrical device is a hydrogen generator.

10. A grounding wire detection circuit, for monitoring whether an electrical device is grounded in real time, the grounding wire detection circuit comprising: a grounding detection circuit and a sampling control circuit, wherein
the grounding detection circuit is electrically connected to a live wire, a neutral wire and a grounding wire in a single-phase three-wire type input, and the live wire and the neutral wire are electrically connected to a main circuit of the electrical device,
the sampling control circuit is configured to isolate a current detected by the grounding detection circuit and convert the current into a sampling voltage,
the grounding detection circuit comprising: a first diode, a current limiting unit and a primary side of a photoelectric coupler, and
an anode of the first diode is electrically connected to the live wire, a cathode of the first diode is electrically connected to an anode of the primary side of the photoelectric coupler, a cathode of the primary side of the photoelectric coupler is electrically connected to a first terminal of the current limiting unit, and a second terminal of the current limiting unit is electrically connected to the grounding wire.

11. The grounding wire detection circuit according to claim 10, the sampling control circuit comprising: a power supply, a secondary side of a photoelectric coupler and a sampling resistor, wherein the power supply is electrically connected to the secondary side of the collector of the photoelectric coupler, and an emitter of the photoelectric coupler secondary side is electrically connected to a first terminal of the sampling resistor.

12. The grounding wire detection circuit according to claim 11, wherein the sampling control circuit further comprises a capacitor connected in parallel with the sampling resistor.

13. The grounding wire detection circuit according to claim 12, wherein the sampling control circuit further comprises a post-stage monitoring control circuit, configured to receive the sampling voltage and realize a protection function comprising alarming and cutting off the electrical device.

14. The grounding wire detection circuit according to claim 13, wherein the post-stage monitoring control circuit is a microcontroller unit.

15. The grounding wire detection circuit according to claim 10, wherein the current limiting unit is a resistor or a Transient Voltage Suppressor.

* * * * *